(12) United States Patent
Weir (10) Patent No.: US 11,935,550 B1
(45) Date of Patent: Mar. 19, 2024

(54) AUDIO COMPRESSION FOR LOW OVERHEAD DECOMPRESSION

(71) Applicant: The ADT Security Corporation, Boca Raton, FL (US)

(72) Inventor: Andrew P. Weir, Boca Raton, FL (US)

(73) Assignee: The ADT Security Corporation, Boca Raton, FL (US)

( * ) Notice: Subject to any disclaimer, the term of this patent is extended or adjusted under 35 U.S.C. 154(b) by 0 days.

(21) Appl. No.: 18/193,761

(22) Filed: Mar. 31, 2023

(51) Int. Cl.
*G10L 19/00* (2013.01)
*G10L 19/022* (2013.01)
*G10L 19/032* (2013.01)

(52) U.S. Cl.
CPC .......... *G10L 19/032* (2013.01); *G10L 19/022* (2013.01)

(58) Field of Classification Search
CPC ....... G10L 21/04; G10L 19/005; G10L 19/04; G10L 19/167; G10L 19/0208; H03M 7/30; H03M 3/04; H03M 1/66; H03M 1/661
See application file for complete search history.

(56) References Cited

U.S. PATENT DOCUMENTS

| | | | | |
|---|---|---|---|---|
| 4,437,087 A * | 3/1984 | Petr | ...................... | H04B 14/068 375/216 |
| 4,513,426 A * | 4/1985 | Jayant | ................... | H03M 3/042 375/243 |
| 4,516,241 A * | 5/1985 | Farah | .................... | H04B 14/068 370/465 |
| 4,617,599 A * | 10/1986 | Noguchi | ................ | G11B 5/035 |
| 4,791,483 A * | 12/1988 | Miller | ..................... | H04N 19/50 375/245 |
| 4,860,313 A * | 8/1989 | Shpiro | ................... | H03M 3/042 375/240 |
| 4,885,637 A * | 12/1989 | Shikakura | .............. | H04N 19/50 375/E7.243 |
| 5,083,310 A * | 1/1992 | Drory | .............. | G11B 20/00007 704/212 |
| 5,107,519 A * | 4/1992 | Ishikawa | .............. | H04N 19/126 375/245 |
| 5,406,560 A * | 4/1995 | Kondo | .................... | G10L 19/04 370/465 |

(Continued)

OTHER PUBLICATIONS

Jayant, Signal Compression, Coding of Speech, Audio, Text, Image and Video, 1997, World Scientific, Selected Topics in electronics and Systems—vol. 9, pp. 1-52 (Year: 1997).*

*Primary Examiner* — Olujimi A Adesanya
(74) *Attorney, Agent, or Firm* — Christopher & Weisberg, P.A.

(57) ABSTRACT

A system comprising an audio compression device is provided. The audio compression device receives a plurality of pulse code modulated (PCM) samples, performs a quantization of the plurality of the PCM samples, and determines a plurality of time windows for the plurality of quantized PCM samples. The audio compression device further determines a first number of delta bits and a first sample count for a first time window of a plurality of time windows, where the first time window includes a first group of time-domain consecutive samples according to the first sample count. The audio compression device encodes the sample into the first number of delta bits based on a difference from a previous sample to generate a first stream of delta bits, and encodes the first sample count and the first number of delta bits in a corresponding first header for the first time window.

20 Claims, 5 Drawing Sheets

(56) References Cited

U.S. PATENT DOCUMENTS

| | | | | |
|---|---|---|---|---|
| 5,621,851 | A * | 4/1997 | Moriya | H04B 14/06 |
| | | | | 704/211 |
| 5,956,674 | A * | 9/1999 | Smyth | G10L 19/0208 |
| | | | | 704/503 |
| 5,960,401 | A * | 9/1999 | Rao | G10L 19/035 |
| | | | | 704/500 |
| 7,256,340 | B2 * | 8/2007 | Okazaki | G10H 7/12 |
| | | | | 84/604 |
| 2002/0069052 | A1 * | 6/2002 | Chen | G10L 19/04 |
| | | | | 704/E19.023 |
| 2002/0130956 | A1 | 9/2002 | Susuki | |
| 2008/0018502 | A1 * | 1/2008 | Wegener | H03M 7/30 |
| | | | | 341/50 |
| 2008/0078280 | A1 | 4/2008 | Okazaki et al. | |
| 2010/0191538 | A1 * | 7/2010 | Kovesi | G10L 19/24 |
| | | | | 704/500 |
| 2011/0224991 | A1 * | 9/2011 | Fejzo | G10L 19/0017 |
| | | | | 704/500 |
| 2011/0260893 | A1 * | 10/2011 | Sato | G10L 19/04 |
| | | | | 341/51 |
| 2012/0236845 | A1 | 9/2012 | Li et al. | |
| 2015/0277853 | A1 | 10/2015 | Li et al. | |
| 2021/0297777 | A1 * | 9/2021 | Soulier | H04W 4/80 |

* cited by examiner

AUDIO COMPRESSION FOR LOW OVERHEAD DECOMPRESSION

TECHNICAL FIELD

The present technology is generally related to audio compression and decompression in which the decompression uses a low computational overhead and data storage footprint.

BACKGROUND

Many types of devices, such as embedded controllers or Internet of Things (IoT) devices, may be configured to operate with a low power consumption, e.g., due to power constraints, such as relying on energy from a battery, a solar panel, etc. Such devices may also have a constrained amount of storage (e.g., flash memory) for storing data, code, etc., and may also have limited computational resources, e.g., a processor or microcontroller designed to operate at a relatively low frequency, as compared to high power computing devices, such as servers, personal computers (PCs), tablet computer devices, etc. In many cases, these low-power devices, minimal-storage devices, and/or low-computational resource devices may have a relatively complex set of tasks to perform, which may require significant non-volatile (e.g., flash memory) storage.

One example of such a device is a wireless keypad, such as a wireless keypad configured as a user interface device for a premises security system. A wireless keypad may include, for example, an embedded system-on-a-chip (SoC) that has 512 kilobytes (KB) of non-volatile storage in the form of on-chip flash and 380 KB of internal static random access memory (RAM), and may include additional processing circuitry, such as one or more processors. The wireless keypad may be configured to render digital audio to a digital to analog converter (DAC) and/or amplifier. Digital audio may be in the form of brief audio clips played for certain events, such as button presses, alerts, voice cues, etc.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Some embodiments of the present disclosure may be appropriate for applications requiring low-overhead decompression, at the expense of high compression ratios, in consideration of the relatively low computational speed and memory available in the decompression computing environment. For example, some embodiments may be appropriate for applications requiring a 2:1 or 3:1 compression ratio.

Before describing in detail exemplary embodiments, it is noted that some embodiments may reside in combinations of apparatus components and processing steps related to configurations for supporting low-overhead audio decompression. Accordingly, components may be represented where appropriate by conventional symbols in the drawings, focusing on details that facilitate understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a," "an" and "the" are intended to include the plural forms as well, unless the context clearly indicates otherwise. The terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. Multiple components may interoperate and modifications and variations are possible to achieve electrical and data communication.

In some embodiments described herein, the term "coupled," "connected," and the like, may be used herein to indicate a connection, although not necessarily directly, and may include wired and/or wireless connections.

Figure 1:
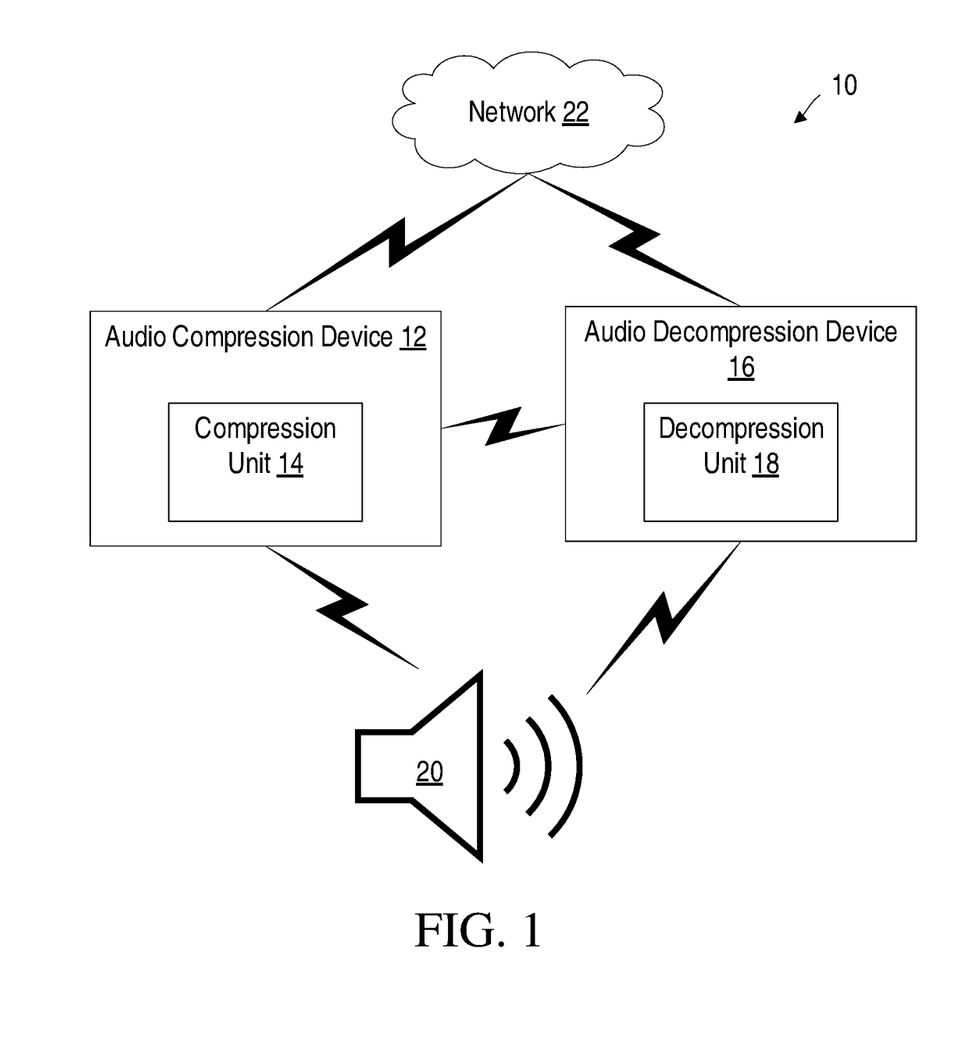
FIG. 1 is a schematic diagram of an example of a system according to some embodiments of the present disclosure.

Referring now to the drawing figures, in which like elements are referred to by like reference numerals, there is shown in FIG. 1 is a schematic diagram of a system 10. System 10 may include an audio compression device 12 (e.g., comprising compression unit 14), audio decompression device 16 (e.g., comprising decompression unit 18), and speaker 20 (which may be a separate device or may be a sub-component of a device, e.g., of the audio decompression device 16, of a keypad, etc.). Audio compression device 12 may be configured to receive, transmit, process, encode, and/or compress audio data, such as via compression unit 14. Audio decompression device 16 may be configured to receive, transmit, process, decode, and/or decompress audio data. Speaker 20 may be configured to receive audio data (e.g., an analog or digital signal output from audio decompression device 16) for playback.

In some embodiments, audio compression device 12 may be a computing device that comprises sufficient computing resources, memory, and/or storage to perform the audio compression techniques described here. For example, audio compression device 12 may be a computer, such as a smartphone, personal computer, or server that provides computing capabilities. In various embodiments, the audio compression device 12 may be provided by a computing environment that includes one or more computing devices. The computing environment may operate as an elastic computing environment for which the allotted capacity of computing-related resources may vary over time. The computing environment may also include and/or be operated as one or more virtualized computer instances that perform various functionality described herein.

In some embodiments, audio decompression device 16 may be a computing device that performs the various audio decompression techniques described herein. For example, audio decompression device 16 may be an embedded device, embedded system, IoT device, reduced-capability device, wired or wireless keypad device, premises security or safety control panel, security sensor, wearable device, SoC, etc. In some embodiments, the audio decompression device 16 has fewer or less powerful computing resources, such as processing resources, memory resources, or battery resources, relative to the audio compression device 12.

In one or more embodiments, audio compression device 12, audio decompression device 16, and speaker 20 may be configured to communicate with each other via one or more communication links and protocols, e.g., to communicate audio data, which may be communicated in a compressed format, a decompressed format, a digital format, and/or an analog format. Further, system 10 may include network 22, which may be configured to provide direct and/or indirect communication, e.g., wired and/or wireless communication, between any two or more components of system 10, e.g., audio compression device 12, audio decompression device 16, and speaker 20. Although network 22 is shown as an intermediate network between components or devices of system 10, any component or device may communicate directly with any other component or device of system 10.

In some embodiments audio compression device 12 may be at least temporarily co-located (e.g., in the same premises) as audio decompression device 16. In other embodiments, audio compression device 12 may be remote and/or separate from audio decompression device 16, e.g., audio compression device 12 may be located in a factory or software development setting where the audio decompression device 16 is configured (e.g., via a direct physical connection and/or a remote and/or wireless connection) with the compressed audio output by the audio compression device 12 and/or one or more intermediate devices.

Figure 2:
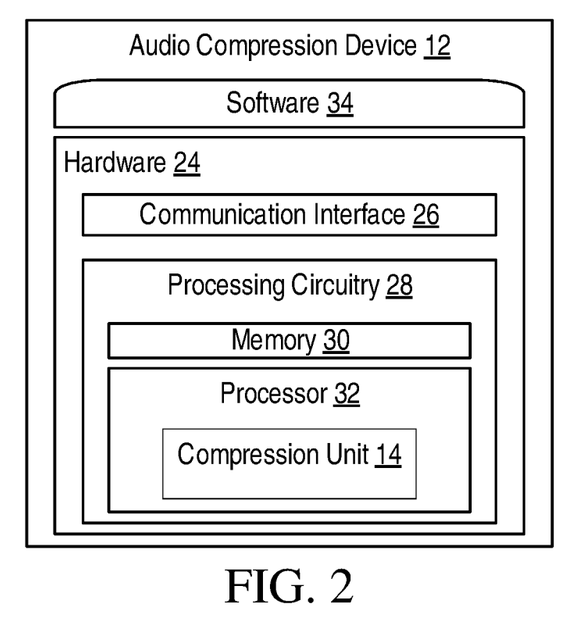
FIG. 2 is a block diagram of an example audio compression device according to some embodiments of the present disclosure.

FIG. 2 shows an example audio compression device 12, which may comprise hardware 24, including communication interface 26 and processing circuitry 28. The processing circuitry 28 may include a memory 30 and a processor 32. In addition to, or instead of a processor, such as a central processing unit, and memory, the processing circuitry 28 may comprise integrated circuitry for processing and/or control, e.g., one or more processors, processor cores, field programmable gate arrays (FPGAs) and/or application specific integrated circuits (ASICs) adapted to execute instructions. The processor 32 may be configured to access (e.g., write to and/or read from) the memory 30, which may comprise any kind of volatile and/or nonvolatile memory, e.g., cache, buffer memory, RAM, read-only memory (ROM), optical memory and/or erasable programmable read-only memory (EPROM), flash memory, etc.

Communication interface 26 may comprise and/or be configured to support communication between audio compression device 12 and any other component of system 10. Communication interface 26 may include at least a radio interface configured to set up and maintain a wireless connection with network 22 and/or any component of system 10. The radio interface may be formed as, or may include, for example, one or more radio frequency, radio frequency (RF) transmitters, one or more RF receivers, and/or one or more RF transceivers. Communication interface 26 may include a wired communication interface, such as an Ethernet interface, configured to set up and maintain a wired connection with network 22 and/or any component of system 10.

Audio compression device 12 may further include software 34 stored internally in, for example, memory 30 or stored in external memory (e.g., database, storage array, network storage device, etc.) accessible by audio compression device 12 via an external connection. The software 34 may be executable by the processing circuitry 28. The processing circuitry 28 may be configured to control any of the methods and/or processes described herein and/or to cause such methods, and/or processes to be performed, e.g., by audio compression device 12. Processor 32 corresponds to one or more processors 32 for performing audio compression device 12 functions described herein. The memory 30 is configured to store data, programmatic software code and/or other information described herein. In some embodiments, the software 34 may include instructions that, when executed by the processor 32 and/or processing circuitry 28, causes the processor 32 and/or processing circuitry 28 to perform the processes described herein with respect to device 12. For example, processing circuitry 28 may include compression unit 14 configured to perform one or more audio compression device 12 functions as described herein such as compressing audio data in a format which enables the audio decompression device 16 to decompress the audio data, as described herein.

Figure 3:
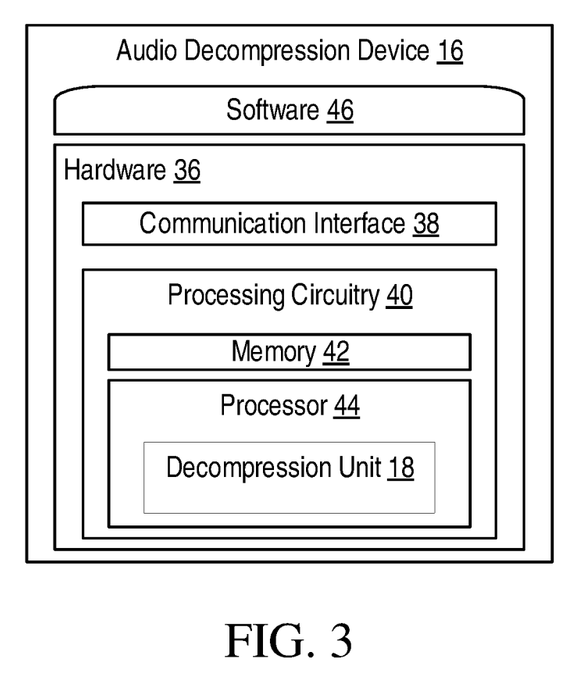
FIG. 3 is a block diagram of an example audio decompression device according to some embodiments of the present disclosure.

FIG. 3 shows an example audio decompression device 16, which may comprise hardware 36, including communication interface 38 and processing circuitry 40. The processing circuitry 40 may include a memory 42 and a processor 44. In addition to, or instead of a processor, such as a central processing unit, and memory, the processing circuitry 40 may comprise integrated circuitry for processing and/or control, e.g., one or more processors, processor cores, FPGAs and/or ASICs adapted to execute instructions. The processor 44 may be configured to access (e.g., write to and/or read from) the memory 42, which may comprise any kind of volatile and/or nonvolatile memory, e.g., cache, buffer memory, RAM, ROM, optical memory and/or EPROM.

In some embodiments, the processing circuitry 40 may comprise a SoC, which may include a limited quantity of memory 42 (e.g., less than 10 MB), and/or which may be configured to operate the processor 44 at a relatively low frequency (e.g., less than 10 MHz), e.g., as compared to processor 32, memory 30, etc. of the audio compression device 12.

Communication interface 38 may comprise and/or be configured to support communication between audio decompression device 16 and any other component of system 10. Communication interface 38 may include at least a radio interface configured to set up and maintain a wireless connection with network 22 and/or any component of system 10. The radio interface may be formed as, or may include, for example, one or more RF transmitters, one or more RF receivers, and/or one or more RF transceivers. Communication interface 38 may include a wired communication interface, such as an Ethernet interface, configured to set up and maintain a wired connection with network 22 and/or any component of system 10.

Audio decompression device 16 may further include software 46 stored internally in, for example, memory 42 or stored in external memory (e.g., database, storage array, network storage device, etc.) accessible by audio decompression device 16 via an external connection. The software 46 may be executable by the processing circuitry 40. The processing circuitry 40 may be configured to control any of the methods and/or processes described herein and/or to cause such methods, and/or processes to be performed, e.g., by audio decompression device 16. Processor 44 corresponds to one or more processors 44 for performing audio decompression device 16 functions described herein. The memory 42 is configured to store data, programmatic software code and/or other information described herein. In some embodiments, the software 46 may include instructions that, when executed by the processor 44 and/or processing circuitry 40, causes the processor 44 and/or processing circuitry 40 to perform the processes described herein with respect to audio decompression device 16. For example, processing circuitry 40 may include decompression unit 18 configured to perform one or more audio decompression device 16 functions as described herein such as receiving compressed audio data from the audio compression device 12, decompressing the compressed audio data according to a low-power, low-processor-frequency, and/or low-memory-storage process, and providing the decompressed audio data and/or signal to speaker 20 for playback.

Figure 4A:
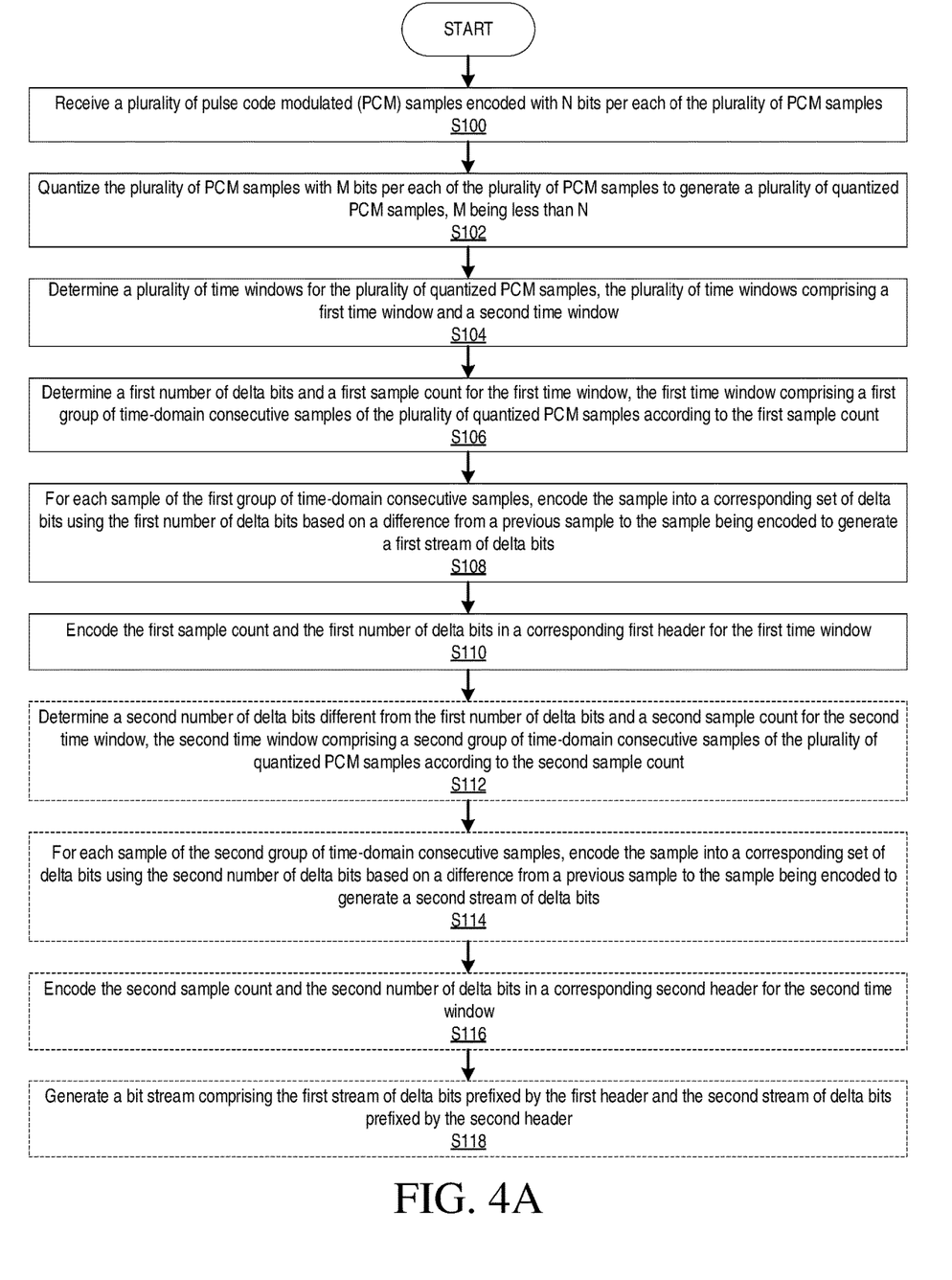
FIG. 4A and FIG. 4B is a flowchart of an example process in an example system including an audio compression device and an audio decompression device, according to some embodiments of the present disclosure.
Figure 4B:
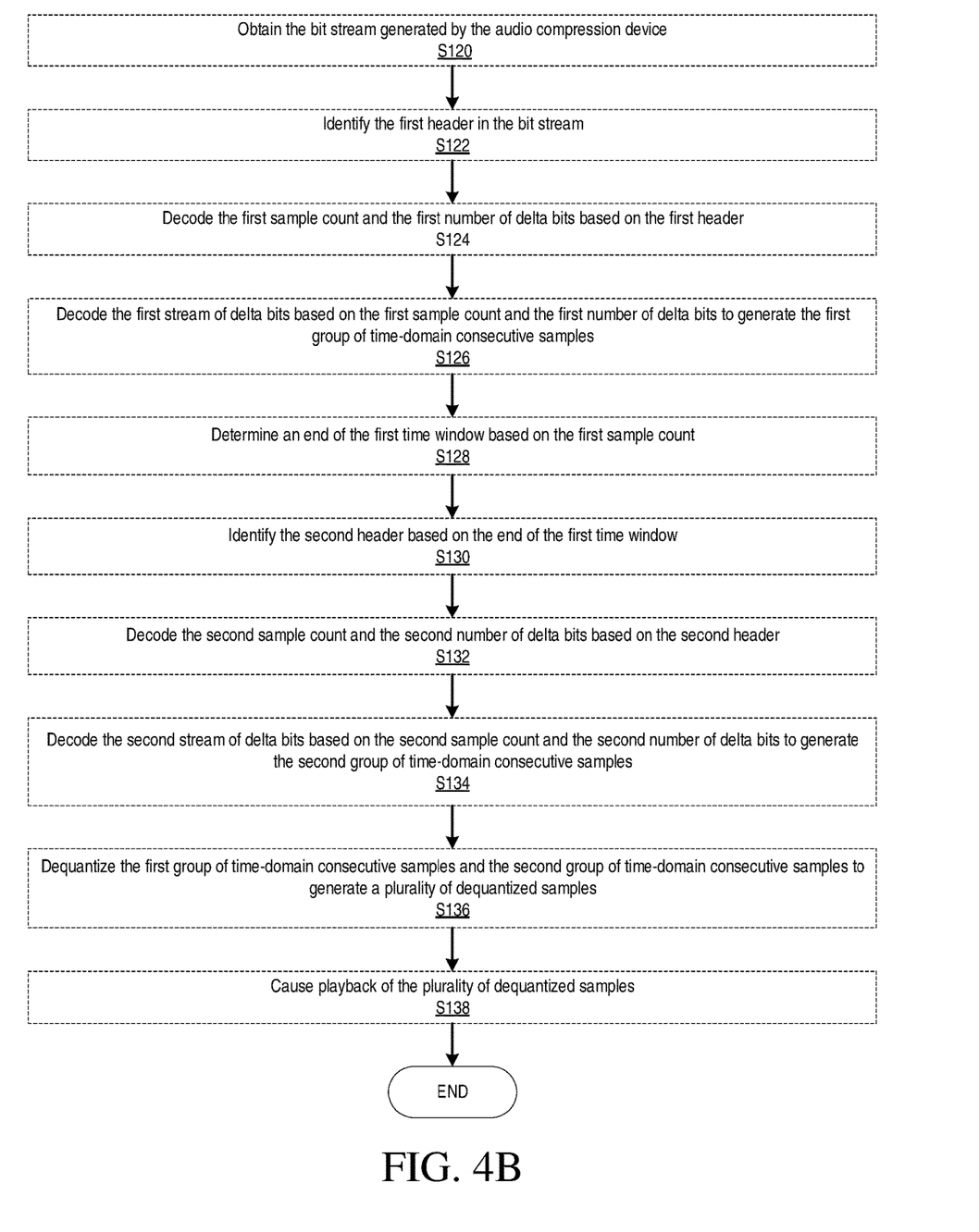

FIG. 4A and FIG. 4B illustrate a flowchart of an example process (i.e., method) implemented in a system 10 by audio compression device 12, audio decompression device 16, and speaker 20, according to some embodiments of the present disclosure. Steps that are optional in this particular embodiment are depicted in FIG. 4A and FIG. 4B with a dashed line. One or more steps depicted in FIGS. 4A-4B may also be optional in other embodiments.

One or more blocks described herein may be performed by one or more elements of audio compression device 12, such as by one or more of processing circuitry 28, compression unit 14, and/or communication interface 26, by one or more elements of audio decompression device 16 such as by one or more of processing circuitry 40, decompression unit 18, and/or communication interface 38. Audio compression device 12 is configured to receive (Block S100) a plurality of pulse code modulated (PCM) samples encoded with N bits per each of the plurality of PCM samples. Audio compression device 12 is configured to quantize (Block S102) the plurality of PCM samples with M bits per each of the plurality of PCM samples to generate a plurality of quantized PCM samples, where M is less than N. Audio compression device 12 is configured to determine (Block S104) a plurality of time windows for the plurality of quantized PCM samples, where the plurality of time windows includes a first time window and a second time window. Audio compression device 12 is configured to determine (Block S106) a first number of delta bits and a first sample count for the first time window, where the first time window includes a first group of time-domain consecutive samples of the plurality of quantized PCM samples according to the first sample count. Audio compression device 12 is configured to, for each sample of the first group of time-domain consecutive samples, encode (Block S108) the sample into a corresponding set of delta bits using the first number of delta bits based on a difference from a previous sample to the sample being encoded to generate a first stream of delta bits. Audio compression device 12 is configured to encode (Block S110) the first sample count and the first number of delta bits in a corresponding first header for the first time window.

In some embodiments, encoding a sample count in a header for a time window may include, e.g., encoding a number of samples (e.g., a bit field representing a number, such as 582, of samples for a corresponding time window). In some embodiments, encoding a sample count in a header for a time window may include, e.g., encoding a number of blocks (e.g., labeled as "num_blocks" or "blockCount"), where the number of samples per block (e.g., labeled as "samples per block" or "blockSize") is defined, e.g., in the file-level header or may be a preconfigured value, and the num_blocks (blockCount) is defined for each subheader (e.g., header 1 for time window 1, header 2 for time window 2, etc.) so that the number of samples for each time window (e.g., the number of samples in a "wad" of samples corresponding to the time window) may be obtained using a preconfigured formula by the audio decompression device 16, e.g., multiplication of [num_blocks]*[samples_per_block]. In some embodiments, encoding a sample count in a header may include encoding an index value, where each index value maps to a predefined number of blocks according to, e.g., a mapping (using, for example, a table) as defined in the file-level header, or preconfigured in the audio decompression device 16, etc. Other techniques for encoding or recording or indicating a sample count in a header for a time window may be used without deviating from the scope of the present disclosure.

Audio compression device 12 is configured to (optionally) determine (Block S112) a second number of delta bits different from the first number of delta bits and a second sample count for the second time window, where the second time window comprises a second group of time-domain consecutive samples of the plurality of quantized PCM samples according to the second sample count. Audio compression device 12 is configured to, (optionally) for each sample of the second group of time-domain consecutive samples, encode (Block S114) the sample into a corresponding set of delta bits using the second number of delta bits based on a difference from a previous sample to the sample being encoded to generate a second stream of delta bits. Audio compression device 12 is configured to (optionally) encode (Block S116) the second sample count and the second number of delta bits in a corresponding second header for the second time window. Audio compression device 12 is configured to generate (Block S118) a bit stream comprising the first stream of delta bits prefixed by the first header and the second stream of delta bits prefixed by the second header.

In some embodiments, bit stream may be provided to the audio decompression device 16, e.g., via a live update of an audio decompression device 16, such as through a wired, wireless, or remote connection, so that audio decompression device 16 may store and/or decompress the bit stream. In some embodiments, configuring the audio decompression device 16 with the bit stream may occur, e.g., in a factory setting, for instance, by loading the compressed bit stream (compressed by audio compression device 12) into memory 42 of the audio decompression device, which may include an additional intermediate step of storing the compressed audio file in intermediate storage and/or device(s) before it is loaded into the decompression device.

Audio decompression device 16 is configured to obtain (and/or receive and/or store) (Block S120) the bit stream generated by the audio compression device. Audio decompression device 16 is configured to identify (Block S122) the first header in the bit stream. Audio decompression device 16 is configured to decode (Block S124) the first sample count and the first number of delta bits based on the first header. Audio decompression device 16 is configured to decode (Block S126) the first stream of delta bits based on the first sample count and the first number of delta bits to generate the first group of time-domain consecutive samples. Audio decompression device 16 is configured to determine (Block S128) an end of the first time window based on the first sample count. Audio decompression device 16 is configured to identify (Block S130) the second header based on the end of the first time window. Audio decompression device 16 is configured to decode (Block S132) the second sample count and the second number of delta bits based on the second header. Audio decompression device 16 is configured to decode (Block S134) the second stream of delta bits based on the second sample count and the second number of delta bits to generate the second group of time-domain consecutive samples. Audio decompression device 16 is configured to dequantize (Block S136) the first group of time-domain consecutive samples and the second group of time-domain consecutive samples to generate a plurality of dequantized samples, and to cause playback (Block S138) on the speaker 20 (e.g., via a direct or indirect connection) of the plurality of dequantized samples. Any one or more of the above steps (Blocks S120-S138) may be considered optional, in some embodiments.

In some embodiments, the audio compression device 12 is further configured to append a file-level header to the bit stream, the file-level header indicating at least one of a sample rate of the bit stream, a number of audio channels of the bit stream, a sample size of the bit stream, a quantization amount of the bit stream, a block size for the bit stream, or a maximum block size for the bit stream. The audio decompression device 16 is further configured to identify the first time window based on the file-level header, identify the first sample count or the second sample count based on the block size, or identify the first sample count or the second sample count based on the maximum block size. Further, in some embodiments, the audio decompression device 16 may use the information in the file-level header for any one or more of the above-described processes (e.g., any of Blocks S120-S138).

In some embodiments, the audio compression device 12 is further configured to encode the first sample count as a first index value in the first header according to a predefined mapping of index values to corresponding sample counts, and encode the second sample count as a second index value in the second header according to the predefined mapping. The audio decompression device 16 may then utilize the index values to determine sample counts, e.g., according to a preconfigured mapping of index values to sample counts stored in memory 42, memory 30, etc., and/or according to a mapping provided in the file-level header.

In some embodiments, the audio compression device 12 is further configured to encode the first sample count as a first block count in the first header according to a predefined number of samples per block, and encode the second sample count as a second block count in the second header according to the predefined number of samples per block. The predefined number of samples per block may be indicated in the file level header, or may be preconfigured, e.g., in memory 42, memory 30, etc. The audio decompression device 16 may then utilize the predefined number of samples per block and the block counts to determine sample counts for each time window.

Embodiments of the present disclosure may be further described according to the following examples and embodiments.

Embodiments of the present disclosure support configurations for compressing and decompressing audio according to a compression algorithm that results in a compressed audio file and/or bit stream which requires only a minimal amount of computational and memory resources for decompression. Embodiments of the present disclosure may support one or more of quantization, difference coding, difference bits clamping, variable block-size, and variable maximum block count, as described herein. Some embodiments of the present disclosure provide a combination of quantization and difference coding, in combination with additional optional features, resulting in an increased compression ratio, as compared to existing systems. Some other existing systems for audio compression and decompression, such as existing delta and adaptive-delta algorithms, are of higher complexity and require greater computational resources and memory, as compared to some embodiments of the present disclosure. Further, existing solutions do not include per-file variable quantization, as described herein with respect to some embodiments.

Some embodiments of the present disclosure may perform computations (e.g., in the processing circuitry 28 and/or processing circuitry 40) in the time domain (e.g., without requiring transformation of data into or from a frequency domain).

Embodiments of the present disclosure may provide lower decompression (e.g., by the audio decompression device 16) computation cost and memory footprint cost, as compared to some existing systems. The compression tool, which may operate "offline" (e.g., the audio data is compressed into a compressed audio file by audio compression device 12 during a design and/or manufacturing and/or configuration process, i.e., prior to distribution or deployment of the audio decompression device 16 which is configured with a compressed audio file). Thus, in some embodiments, the compression process may be computationally intensive and/or memory intensive, as audio compression device 12 may, in some implementations, have substantially greater resources than the audio decompression device 16, and may be able to operate on much longer time scales (e.g., compression may take minutes or hours to process, whereas decompression may be required to occur in microseconds to prevent an undesirable delay in playing the audio on speaker 20).

In some embodiments, compression and decompression are according to an algorithm which combines one or more of per-sample quantization, sample difference coding, block-based determination of the number of difference bits to apply, difference bits clamping, and a variable block size and block count. Embodiments of the present disclosure may be referred to as quantized, adaptive-delta PCM compression (QADPCM), where the adaptive element may correspond to the (adaptive) determination of difference bits.

In some embodiments, compression and decompression may be configured to utilize a quantization. For example, in some embodiments, quantization may include reducing a 16-bit PCM sample down to between 8 and 12 bits. Other examples of sample bit sizes and reduction amounts may be utilized (e.g., reducing a 32-bit PCM sample to between 16 and 20 bits, etc.). The quantization may be performed (e.g., by audio compression device 12) by, for example, removing the requisite number of least-significant bits from each 16-bit PCM sample (e.g., removing 4 bits to obtain a 12-bit "sample"). In some embodiments, audio decompression device 16 receives the compressed audio file, and performs a decompression in which, for example, the least-significant bits of the samples are filled in with zeros (e.g., adding 4 bits to a 12-bit sample to obtain a 16-bit PCM sample), thereby maintaining the approximate magnitude of the original sample. This may be referred to as a "dequantization", i.e., an inverse operation of the quantization. Other dequantization techniques may be used (e.g., filling in the least-significant bits of the samples with random numbers, etc.), without deviating from the scope of the present disclosure. The quantization may be applied uniformly across a sound event or file. The amount of quantization may be determined, e.g., subjectively, via user input, such as by increasing the quantization up to a threshold amount at which the audio clip quality becomes objectionable, unclear, inaudible, etc. to a typical listener, and determining a proper quantization amount to be at least a (preconfigured) margin less than that threshold amount. For example, sounds that are very noisy or that contain a lot of harmonic content may tolerate significant amounts of quantization, without losing audibility, whereas sounds with constant pure tones or sounds with start or end fading typically may tolerate less amounts of quantization.

In some embodiments, a delta coding is used by audio compression device 12 and audio decompression device 16. For example, audio compression device 12 may be configured to calculate a difference (e.g., a signed difference) between the previous sample(s) and current sample(s), and uses that difference to encode the current sample. The number of bits to use for the difference encoding may be determined on a per-"wad" (and/or per time-window) basis, where a "wad" refers to a grouping of consecutive samples or blocks of consecutive samples, as described herein.

In some embodiments, audio compression device 12 and audio decompression device 16 may be configured to support maximum delta-bits clamping. For example, audio compression device 12 may determine, for a sound event or file, a histogram type data structure in which samples are mapped to numbers of bits required. For example, the mapping may identify how many samples require 1 delta bit, how many samples require 2 delta bits, how many samples require 3 bits, etc. In many cases, the non-zero bin with the greatest number of delta bits required may contain a relatively low sample count. For example, a file that contains 30,000 samples may only have 200 samples that require 9 delta bits, and 0 samples that require more than 9 delta bits. In this case, the delta bits may be clamped at 8, for example, as determined by audio compression device 12. When delta bits clamping is applied, the audio compression device 12 may, in certain cases, apply a maximum delta possible, and may continue to "chase" the current sample value. Thus, in some embodiments, there may be some additional inharmonic and/or harmonic distortion caused by max delta bits clamping, which may not be audible to a typical listener. In some embodiments, a mild low-pass filter effect may further be applied, e.g., for sounds that have high frequency content that is also high in amplitude, so as to further improve the quality of the sound and of the audio after decompression. Thus, user feedback may be utilized in some embodiments for determining a proper delta-bits clamping setting (e.g., how many delta bits to clamp).

In some embodiments, the audio compression device 12 and audio decompression device 16 may be configured to support compression and decompression, respectively, that uses adapting of delta-bits on a per "wad" (and/or per time-window) basis. For example, the audio compression device 12 may be configured to determine at least two parameters (e.g., a first parameter and second parameter) for compression and/or decompression. The first parameter corresponds to a block size, which corresponds to a sample count. The second parameter corresponds to a maximum block count parameter that determines how many bits (unsigned) are required per wad (and/or per time window), and may be used to indicate the wad size (and/or the total number of samples in a time window). As the audio compression device 12 analyzes and/or processes the audio file for compression, it determines what the maximum delta bits requirement is for a block. The audio compression device 12 determines how many consecutive blocks have the same maximum delta requirement, up to and including the maximum block count. The "block size times block count" quantity (i.e., number of samples) may be grouped together as a "wad" or time-window. The audio compression device 12 may be configured to encode the audio file by prefixing each wad with at least two parameters: the number of delta bits encoded per sample in that wad and the number of blocks contained in that wad. The audio decompression device 16 may be configured to utilize these parameters for the decompression of the corresponding wad(s). The block size and/or the maximum block count may be determined per sound file by the audio compression device 12. This may be determined by the audio compression device 12, for example, by using exhaustive analysis of block sizes and block counts, within a reasonable range. For example, using a smaller max block count may reduce the number of bits required to encode the block count per wad (and/or per time window).

In some embodiments, the audio compression device 12 and audio decompression device 16 may be configured to support compression and/or decompression using bitstream encoding. In some embodiments, bitstream encoding as described herein may result in less computationally expensive encoding and/or decompression as compared, e.g., to Huffman coding, Context-adaptive binary arithmetic coding (CABAC) coding, etc. In some embodiments, for example, the variable-width bit fields used by audio compression device 12 to encode the wad prefix and the samples may be accumulated into 32-bit word elements and written out as they become full. Other bit sizing configuration may apply, e.g., 64-bit word elements, N-bit word elements, etc., in other embodiments. If the last word is not full, it may be flushed out at the end of the encoding process. The audio decompression device 16, in turn, fetches one 32-bit (or N-bit) word at a time (e.g., from a buffer, from memory 42, etc.) and processes the bit fields as required until it needs to fetch a new one.

An example structure of a QADPCM file (e.g., an audio file or stream compressed by the audio compression device 12 for decompression by audio decompression device 16) according to one or more embodiments of the present disclosure, may include one or more of the following:

The QADPCM file may include a Header (e.g., a file-level header). The Header may include, for example, one or more fields. For example, the Header may include a Sample Rate field, which may comprise a value or index indicating a sample rate, such as 16 kHz, 32 kHz, etc. The Header may include a Number of Audio Channels field, which may comprise a value or index indicating a number of audio channels, such as 1, 2, 3, etc. The Header may include a Quantization Amount field, which may comprise a value or index indicating an amount by which the N-bit samples were quantized. The Header may include a Block Size field, which may comprise a value or index indicating a size of the block. The Header may include a Block Count Bits field (i.e., a Max Block Size), which may comprise a value or index indicating a size of a block. The information in these Header fields may be used by the audio decompression device 16 to decompress the compressed audio accordingly, as described herein.

The QADPCM file may further include a BitStream (e.g., subsequent to the Header). The BitStream may include a plurality of time windows each comprising a plurality of samples (e.g., a "wad" of samples). For each time window of the BitStream, there is a corresponding header (also referred to herein as a "sub-header", i.e., of the file-level header). Each header of each time window comprises one or more fields including information for decompressing the samples of the time window, including a Diff-bits field, which may comprise a value or index corresponding to a number of difference bits for the corresponding time window (e.g., a 4-bit unsigned field, or any number of bits as configured), and/or a Block Count field, which may comprise a value or index corresponding to a block count for the corresponding time window (e.g., a 4-bit unsigned field, or any number of bits as configured). For each time window, following the corresponding header (i.e., sub-header) for each of [Block Size*Block Count] samples of the time window, the BitStream includes a number of Sample delta bits (e.g., 'Dif-bits' bits, signed).

The above example data structure is merely an example, and other orderings, bit numbers, etc., may be used without deviating from the scope of the present disclosure.

Figure 5:
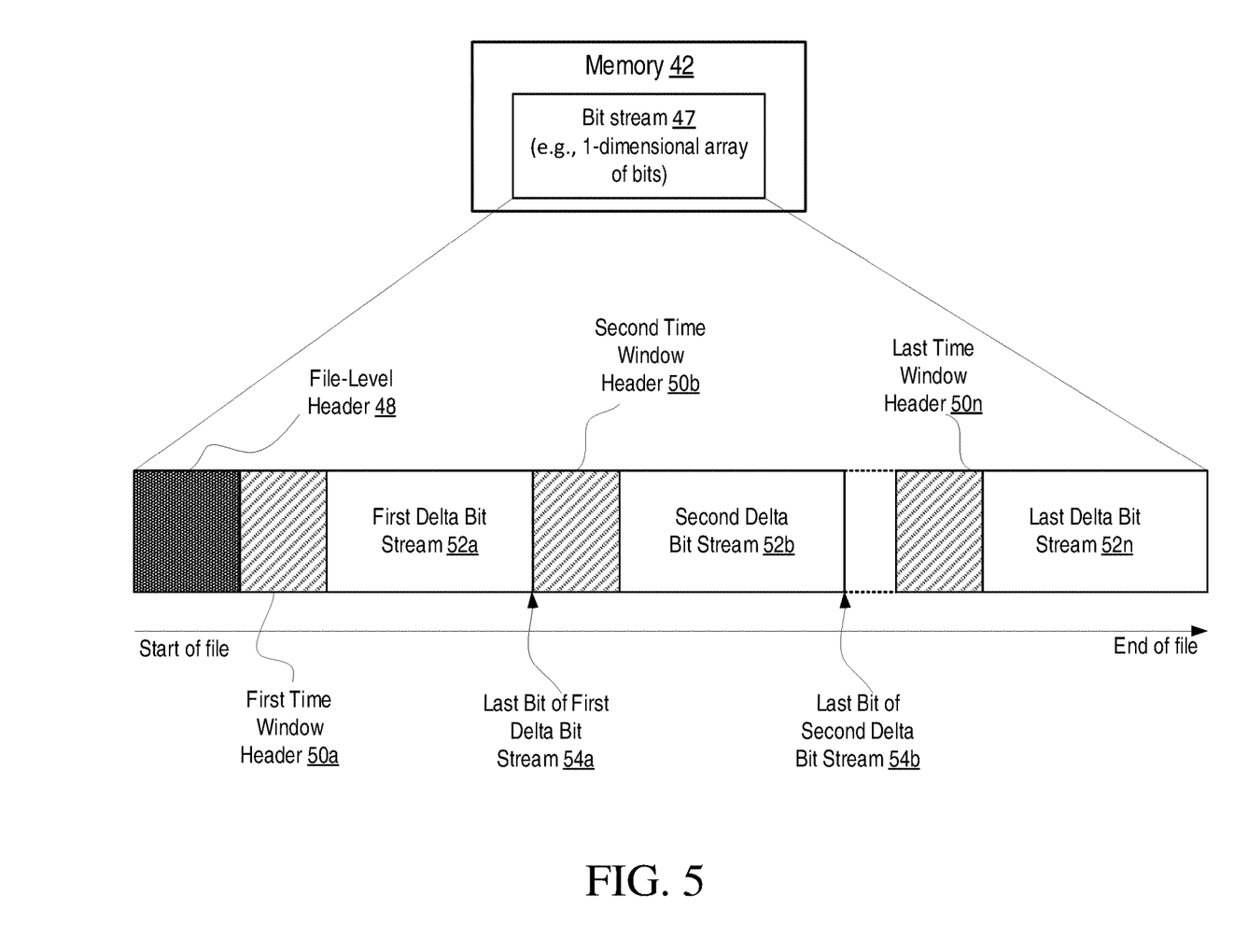
FIG. 5 is a diagram illustrating an example bit stream encoded according to some embodiments of the present disclosure.

An example of a bit stream 47 stored in memory 42 of the audio decompression device 16 (e.g., a QADPCM file represented by a 1-dimensional (e.g., linear) array of bits) according to some embodiments of the present disclosure is illustrated in the diagram of FIG. 5. A file-level header 48 is appended to the beginning of the file or bit stream (although in some embodiments, the file-level header may be located elsewhere, e.g., at the end of the file/bit stream, in a predefined location, etc.). The file-level header 48 may include (global) information that is used to decompress all wads, blocks, time windows, etc. within the file, e.g., sample rate, number of audio channels, quantization amount, block size, maximum block size, etc. In the example of FIG. 5, subsequent to the header, the first time window (e.g., the first "wad") begins with a corresponding first time window header 50a, which may be considered a "sub-header" of the file-level header. The first time window header 50a may include information for decompressing the delta bits of the first delta bit stream 52a, such as the number of difference bits encoded in the first time window, the number of samples in the time window, etc. The first delta bit stream 52a includes the compressed delta bits for the first time window, which end with a final delta bit 54a. Immediately subsequent to the final delta bit 54a (or following an additional preconfigured number of buffer bits) is the second time window header 50b, which contains information for decompressing the delta bits of the second delta bit stream 52b, which ends with a final delta bit 54b, which may be followed by one or more subsequent time window headers 50 and corresponding delta bit streams 52, up to and including a last time window header 50n and a corresponding last delta bit stream 52n.

The concepts described herein may be embodied as a method, data processing system, computer program product and/or computer storage media storing an executable computer program. Any process, step, action and/or functionality described herein may be performed by, and/or associated to, a corresponding module, which may be implemented in software and/or firmware and/or hardware. Furthermore, the disclosure may take the form of a computer program product on a tangible computer usable storage medium having computer program code embodied in the medium that can be executed by a computer. Any suitable tangible computer readable medium may be used including hard disks, CD-ROMs, electronic storage devices, optical storage devices, or magnetic storage devices.

Some embodiments are described herein with reference to flowchart illustrations and/or block diagrams of methods, systems and computer program products. Each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process, such that the instructions that execute on the computer or other programmable apparatus provide steps for implementing the functions/acts described herein.

The functions and acts noted in the blocks of the figures may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, communication may occur in the opposite direction to the depicted arrows.

Computer program code for carrying out operations of the concepts described herein may be written in an object-oriented programming language such as Python, Java® or C++. However, the computer program code for carrying out operations of the disclosure may also be written in procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In addition, unless mention was made above to the contrary, all of the accompanying drawings are not to scale. A variety of modifications and variations are possible in light of the above teachings without departing from the scope and spirit of the present disclosure.

What is claimed is:

1. A system, comprising:
   an audio compression device comprising processing circuitry configured to:
   receive a plurality of pulse code modulated (PCM) samples encoded with N bits per each of the plurality of PCM samples;
   quantize the plurality of PCM samples with M bits per each of the plurality of PCM samples to generate a plurality of quantized PCM samples, M being less than N;
   determine a plurality of time windows for the plurality of quantized PCM samples, the plurality of time windows comprising a first time window and a second time window;
   determine a first number of delta bits and a first sample count for the first time window, the first time window comprising a first group of time-domain consecutive samples of the plurality of quantized PCM samples according to the first sample count;
   for each sample of the first group of time-domain consecutive samples, encode the sample into a corresponding set of delta bits using the first number of delta bits based on a difference from a previous sample to the sample being encoded to generate a first stream of delta bits;
   encode the first sample count and the first number of delta bits in a corresponding first header for the first time window;
   determine a second number of delta bits different from the first number of delta bits and a second sample count for the second time window, the second time window comprising a second group of time-domain consecutive samples of the plurality of quantized PCM samples according to the second sample count;
   for each sample of the second group of time-domain consecutive samples, encode the sample into a corresponding set of delta bits using the second number of delta bits based on a difference from a previous sample to the sample being encoded to generate a second stream of delta bits;
   encode the second sample count and the second number of delta bits in a corresponding second header for the second time window; and
   generate a bit stream comprising the first stream of delta bits prefixed by the first header and the second stream of delta bits prefixed by the second header;
   an audio decompression device configured to be in communication with the audio compression device, the audio decompression device comprising processing circuitry configured to:
   obtain the bit stream generated by the audio compression device;
   identify the first header in the bit stream;
   decode the first sample count and the first number of delta bits based on the first header;
   decode the first stream of delta bits based on the first sample count and the first number of delta bits to generate the first group of time-domain consecutive samples;
   determine an end of the first time window based on the first sample count;
   identify the second header based on the end of the first time window;
   decode the second sample count and the second number of delta bits based on the second header;
   decode the second stream of delta bits based on the second sample count and the second number of delta bits to generate the second group of time-domain consecutive samples;
   dequantize the first group of time-domain consecutive samples and the second group of time-domain consecutive samples to generate a plurality of dequantized samples; and
   cause playback of the plurality of dequantized samples.

2. The system of claim 1, wherein the processing circuitry of the audio compression device is further configured to:
   append a file-level header to the bit stream, the file-level header indicating at least one of:
   a sample rate of the bit stream;
   a number of audio channels of the bit stream;
   a sample size of the bit stream;
   a quantization amount of the bit stream;
   a block size for the bit stream; or
   a maximum block size for the bit stream; and
   the processing circuitry of the audio decompression device being further configured to at least one of:
   identify the first time window based on the file-level header;
   identify the first sample count or the second sample count based on the block size; or
   identify the first sample count or the second sample count based on the maximum block size.

3. A system comprising:
   an audio compression device comprising processing circuitry configured to:
   receive a plurality of pulse code modulated (PCM) samples encoded with N bits per each of the plurality of PCM samples;
   quantize the plurality of PCM samples with M bits per each of the plurality of PCM samples to generate a plurality of quantized PCM samples, M being less than N;
   determine a plurality of time windows for the plurality of quantized PCM samples;
   determine a first number of delta bits and a first sample count for a first time window of a plurality of time windows, the first time window comprising a first group of time-domain consecutive samples of the plurality of quantized PCM samples according to the first sample count;
   for each sample of the first group of time-domain consecutive samples, encode the sample into a corresponding set of delta bits using the first number of delta bits based on a difference from a previous sample to the sample being encoded to generate a first stream of delta bits; and
   encode the first sample count and the first number of delta bits in a corresponding first header for the first time window.

4. The system of claim 3, wherein the processing circuitry of the audio compression device is further configured to:
identify a second time window of the plurality of time windows, the second time window being immediately subsequent to the first time window;
determine a second number of delta bits different from the first number of delta bits and a second sample count for the second time window, the second time window comprising a second group of time-domain consecutive samples of the plurality of quantized PCM samples according to the second sample count;
for each sample of the second group of time-domain consecutive samples, encode the sample into a corresponding set of delta bits using the second number of delta bits based on a difference from a previous sample to the sample being encoded to generate a second stream of delta bits; and
encode the second sample count and the second number of delta bits in a corresponding second header for the second time window.

5. The system of claim 4, wherein the processing circuitry of the audio compression device is further configured to:
generate a bit stream comprising the first stream of delta bits prefixed by the first header and the second stream of delta bits prefixed by the second header.

6. The system of claim 5, wherein the processing circuitry of the audio compression device is further configured to:
encode the first sample count as a first index value in the first header according to a predefined mapping of index values to corresponding sample counts; and
encode the second sample count as a second index value in the second header according to the predefined mapping.

7. The system of claim 5, wherein the processing circuitry of the audio compression device is further configured to:
encode the first sample count as a first block count in the first header according to a predefined number of samples per block; and
encode the second sample count as a second block count in the second header according to the predefined number of samples per block.

8. The system of claim 7, wherein the processing circuitry of the audio compression device is further configured to append a file-level header to the bit stream, the file-level header indicating at least one of:
a sample rate of the bit stream;
a number of audio channels of the bit stream;
a sample size of the bit stream;
a quantization amount of the bit stream;
the predefined number of samples per block of the bit stream; or
a maximum block size for the bit stream.

9. The system of claim 8, wherein the system further comprises an audio decompression device in communication with the audio compression device, the audio decompression device comprising processing circuitry configured to:
obtain the bit stream generated by the audio compression device;
identify the first header in the bit stream;
decode the first sample count and the first number of delta bits based on the first header;
decode the first stream of delta bits based on the first sample count and the first number of delta bits to generate the first group of time-domain consecutive samples; and
dequantize the first group of time-domain consecutive samples to generate a first plurality of dequantized samples.

10. The system of claim 9, wherein the processing circuitry of the audio decompression device is further configured to:
determine an end of the first time window based on the first sample count;
identify the second header based on the end of the first time window;
decode the second sample count and the second number of delta bits based on the second header;
decode the second stream of delta bits based on the second sample count and the second number of delta bits to generate the second group of time-domain consecutive samples; and
dequantize the second group of time-domain consecutive samples to generate a second plurality of dequantized samples.

11. The system of claim 1, wherein:
the first number of delta bits corresponds to one of:
a maximum number of delta bits required among the plurality of quantized PCM samples; or
a maximum number of delta bits required among the plurality of quantized PCM samples minus one bit.

12. A method in a system comprising an audio compression device, the method comprising:
receiving a plurality of pulse code modulated (PCM) samples encoded with N bits per each of the plurality of PCM samples;
quantizing the plurality of PCM samples with M bits per each of the plurality of PCM samples to generate a plurality of quantized PCM samples, M being less than N;
determining a plurality of time windows for the plurality of quantized PCM samples;
determining a first number of delta bits and a first sample count for a first time window of a plurality of time windows, the first time window comprising a first group of time-domain consecutive samples of the plurality of quantized PCM samples according to the first sample count;
for each sample of the first group of time-domain consecutive samples, encoding the sample into a corresponding set of delta bits using the first number of delta bits based on a difference from a previous sample to the sample being encoded to generate a first stream of delta bits; and
encoding the first sample count and the first number of delta bits in a corresponding first header for the first time window.

13. The method of claim 12, wherein the method further comprises:
identifying a second time window of the plurality of time windows, the second time window being immediately subsequent to the first time window;
determining a second number of delta bits different from the first number of delta bits and a second sample count for the second time window, the second time window comprising a second group of time-domain consecutive samples of the plurality of quantized PCM samples according to the second sample count;
for each sample of the second group of time-domain consecutive samples, encoding the sample into a corresponding set of delta bits using the second number of delta bits based on a difference from a previous sample to the sample being encoded to generate a second stream of delta bits; and encoding the second sample count and the second number of delta bits in a corresponding second header for the second time window.

14. The method of claim 13, wherein the method further comprises:

generating a bit stream comprising the first stream of delta bits prefixed by the first header and the second stream of delta bits prefixed by the second header.

15. The method of claim 14, wherein the method further comprises:

encoding the first sample count as a first index value in the first header according to a predefined mapping of index values to corresponding sample counts; and encoding the second sample count as a second index value in the second header according to the predefined mapping.

16. The method of claim 14, wherein the method further comprises:

encoding the first sample count as a first block count in the first header according to a predefined number of samples per block; and encoding the second sample count as a second block count in the second header according to the predefined number of samples per block.

17. The method of claim 16, wherein the method further comprises:

appending a file-level header to the bit stream, the file-level header indicating at least one of:
 a sample rate of the bit stream;
 a number of audio channels of the bit stream;
 a sample size of the bit stream;
 a quantization amount of the bit stream;
 the predefined number of samples per block of the bit stream; or
 a maximum block size for the bit stream.

18. The method of claim 17, wherein the system further comprises an audio decompression device in communication with the audio compression device, the method further comprising, in the audio decompression device:

obtaining the bit stream generated by the audio compression device;

identifying the first header in the bit stream;

decoding the first sample count and the first number of delta bits based on the first header;

decoding the first stream of delta bits based on the first sample count and the first number of delta bits to generate the first group of time-domain consecutive samples; and dequantizing the first group of time-domain consecutive samples to generate a first plurality of dequantized samples.

19. The method of claim 18, wherein the method further comprises:

determining an end of the first time window based on the first sample count;

identifying the second header based on the end of the first time window;

decoding the second sample count and the second number of delta bits based on the second header;

decoding the second stream of delta bits based on the second sample count and the second number of delta bits to generate the second group of time-domain consecutive samples; and dequantizing the second group of time-domain consecutive samples to generate a second plurality of dequantized samples.

20. The method of claim 12, wherein:

the first number of delta bits corresponds to one of:
 a maximum number of delta bits required among the plurality of quantized PCM samples; or
 a maximum number of delta bits required among the plurality of quantized PCM samples minus one bit.

* * * * *